United States Patent [19]
Ohta et al.

[11] Patent Number: 5,643,805
[45] Date of Patent: Jul. 1, 1997

[54] PROCESS FOR PRODUCING A BIPOLAR DEVICE

[75] Inventors: Hiroyuki Ohta, Ibaraki-ken; Hideo Miura, Koshigaya; Hiroo Masuda, Tokyo; Yoichi Tamaki, Kokubunji; Takahide Ikeda, Tokorozawa; Asao Nishimura, Ushiku; Takashi Hashimoto, Ome, all of Japan

[73] Assignee: Hitachi, Ltd., Japan

[21] Appl. No.: 401,678

[22] Filed: Mar. 10, 1995

[30] Foreign Application Priority Data

Mar. 18, 1994 [JP] Japan .................. 6-048271

[51] Int. Cl.$^6$ .................................................. H01L 21/265
[52] U.S. Cl. ........................ 437/31; 437/162; 437/909; 437/974; 148/DIG. 10; 148/DIG. 124; 148/DIG. 135
[58] Field of Search ................... 437/31, 32, 162, 437/974, 909; 148/DIG. 10, DIG. 11, DIG. 124, DIG. 135

[56] References Cited

U.S. PATENT DOCUMENTS 5,137,840  8/1992  Desilets .................................. 437/32

FOREIGN PATENT DOCUMENTS 64-36071  2/1989  Japan .
4-188628  7/1992  Japan .

*Primary Examiner*—Tuan H. Nguyen
*Attorney, Agent, or Firm*—Evenson, McKeown, Edwards & Lenahan P.L.L.C.

[57] ABSTRACT

A bipolar device having a level difference between the contact area level of a base electrode and a base region in a silicon substrate, and the contact area level of an emitter electrode and an emitter region in the silicon substrate in the range of 0.03 μm to 0.1 μm by removing undesirable impurities from the emitter region and a predetermined horizontal distance between a sidewall and a device isolation film does not generate dislocation and show good electric characteristics.

12 Claims, 7 Drawing Sheets

PROCESS FOR PRODUCING A BIPOLAR DEVICE

BACKGROUND OF THE INVENTION

This invention relates to a bipolar device and a process for producing the same, more particularly to a high speed bipolar device suitable for use in a semiconductor integrated circuit device, and a process for production thereof.

A high speed bipolar transistor is disclosed, for example, in Japanese Patent Unexamined Publication (JP-A) No. 4-188628, wherein the bipolar transistor comprises a silicon substrate bottom portion having a reverse conductivity type impurity (hereinafter the word "impurity" is sometimes omitted for simplicity), an epitaxial growth layer having a reverse conductivity type, a device isolation film, an active region, a mono conductivity type (p- or n-type) high concentration buried layer, a monoconductivity type low concentration layer, a reverse conductivity type (e.g. p-type impurity)-containing base region, a monoconductivity type (e.g. n-type impurity)-containing emitter region, a base electrode containing a reverse conductivity type impurity in high concentration, an interlaminar insulating film, an emitter electrode, a side wall layer made of a silicon oxide film, an outer base region having a reverse conductivity type, a silicon substrate bottom portion, a collector electrode and a base wiring. Hereinafter, the term "silicon substrate" includes the epitaxial growth layer, the high concentration buried layer, the low concentration layer, the base region, the emitter region and the outer base region. In the production of the active region of the bipolar device, a base electrode containing a reverse conductivity type impurity in high concentration and an interlaminar insulating film are first deposited on the active region of the silicon substrate, followed by formation of an opening by selectively removing the base electrode and the interlaminar insulating film using a mask of a photoresist film. After depositing a silicon oxide film thereon, a side wall layer made of a silicon oxide film is formed at a side wall of the opening by etching back. Then, using this side wall layer and interlaminar insulating film as a mask, a reverse conductivity type impurity and then a monoconductivity type impurity are implanted by ion implantation. After heat treatment, a base region and an emitter region are formed, followed by formation of an emitter electrode in contact with the emitter region.

The above-mentioned process suffers from the problem that the electric characteristics on the surface of the emitter region are easily degraded due to mixing of a reverse conductivity type impurity (e.g. boron, etc.) in addition to a monoconductivity type impurity (e.g. phosphorus, arsenic, etc.) constituting the emitter region.

On the other hand, JP-A-64-36071 discloses a bipolar transistor, wherein a hollow portion surrounded by a side wall is formed in the silicon substrate in the area of an emitter region and a genuine base region, adjacent to a base region, sufficiently deeper than the level of an insulating film formed on the silicon substrate and under a base electrode so as to ensure the connection between the base region and the genuine base region, and to effectively avoid collision of the base region and the emitter region. But according to this process, the difference between the bottom level of the hollow and the level of the bottom of insulating film is so large that dislocation of the parts of the device at the side wall edge during fabrication cannot be prevented, due to an increase of stress in the end portion of the side wall layer which is in contact with the silicon substrate, resulting in degradation of electric characteristics. Further, the increase of stress in this bipolar device structure is substantial with higher integration, so that the electric characteristics are also degraded significantly.

SUMMARY OF THE INVENTION

It is an object of the present invention to provide a bipolar device which exhibits only slight variation of electric characteristics. It is another object of the present invention to provide a bipolar device which generates no dislocation of parts during manufacturing, and has good electric characteristics. It is a further object of the present invention to provide a bipolar device which generates no dislocation even if highly integrated. It is a still further object of the present invention to provide a process for producing such a bipolar device.

The present invention provides a bipolar device comprising a silicon substrate including an epitaxial growth layer, a buried layer, a low-concentration p- or n-type layer, a base region, and an emitter region; an emitter electrode formed in contact with the emitter region and separated by a side wall layer from a base electrode, which is formed in contact with the base region; a device isolation film formed between the base electrode and the silicon substrate and having a distance from the side wall layer; and a collector electrode formed in contact with the buried layer. According to the invention, the level of a contact area between the base electrode and the base region on the one hand, and the level of a contact area between the emitter electrode and the emitter region on the other, are separated by a vertically measured "level difference" which is in the range of 0.03 µm to 0.1 µm, by removing p- or n-type impurities from the emitter region.

The present invention also provides a process for producing a bipolar device, which comprises the steps of:

forming a buried layer on a silicon substrate, followed by formation of a low-concentration p- or n-type layer;

forming a device isolation layer on the silicon substrate by thermal oxidation;

depositing a base electrode and an interlaminar insulating film on a base region in the silicon substrate;

forming an opening by partly removing the base electrode and the interlaminar insulating film, followed by removal of the silicon substrate in the opening in a predetermined amount so as to form a level difference, and formation of a genuine base layer by ion implantation or thermal diffusion method;

forming a side wall layer at a side wall of said opening;

forming an outer base layer in the silicon substrate by heat treatment, using the base electrode as an impurity source;

forming an emitter region on the base region by ion implantation and subsequent heat treatment after the formation of a polycrystalline silicon film;

forming an emitter electrode on the emitter region; and forming a collector electrode in contact with the buried layer.

Other objects, advantages and novel features of the present invention will become apparent from the following detailed description of the invention when considered in conjunction with the accompanying drawings.

DESCRIPTION OF THE PREFERRED EMBODIMENTS

Figure 1:
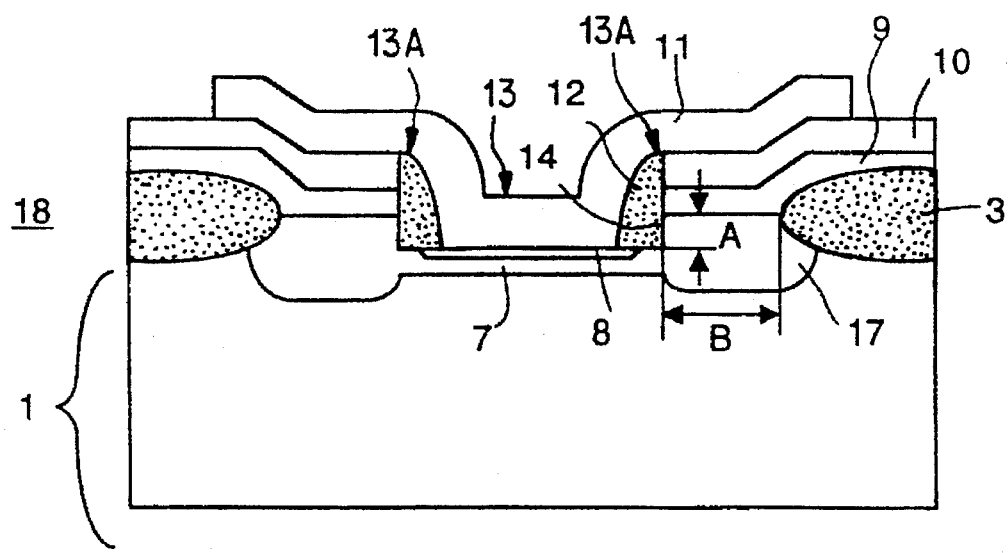
FIG. 1 is a cross sectional view of main portions of a bipolar device according to the invention, as described in Example 1.

The bipolar device of the present invention avoids physical dislocation of the parts of the device during manufacturing and achieves good electric characteristics by making the level of a contact area between the emitter electrode and the emitter region in the silicon substrate lower than the level of a contact area between the base electrode and the base region in the silicon substrate. That is, the above-mentioned problem of prior art can be solved by a proper selection of the difference between the level of the contact area between the base electrode and the base region in the silicon substrate on the one hand, and the level of the contact area between the emitter electrode and the emitter region in the silicon substrate on the other.

The bipolar device of the present invention has the following embodiments.

(1) A bipolar device comprises a silicon substrate including an epitaxial growth layer, a buried layer, a low-concentration p- or n-type impurity (hereinafter "impurity" is sometimes omitted) layer, a base region, and an emitter region; an emitter electrode formed in contact with the emitter region and separated by a side wall layer from a base electrode, which is formed in contact with the base region; a device isolation film formed between the base electrode and the silicon substrate and separated from the side wall layer by a horizontal distance (B); and a collector electrode formed in contact with the buried layer. The level of a contact area between the base electrode and the base region, and the level of a contact area between the emitter electrode and the emitter region have a level difference (A), measured from a depth wherein no impurity is intermixed in the emitter region, up to 0.1 μm, preferably in the range of 0.03 μm to 0.1 μm, by removing p- or n-type impurities from the emitter region.

(2) In the above-mentioned bipolar device, the side wall layer is made from a silicon oxide film, the distance B (FIGS. 1 and 2) is 0.5 μm or less (and preferably 0.1 μm or more), and the level difference A (μm) and the distance B (μm) have the following relationship:

$$0.03 \leq A < 1.25B^2 - 0.35B + 0.06 \quad (1)$$

The lower limit can be changed to a depth wherein no impurity is intermixed in the emitter region.

(3) In the above-mentioned bipolar device, the side wall layer is made from a silicon oxide film in contact with the level difference and a silicon film in contact with the emitter electrode, the distance B is 0.4 μm or less and preferably 0.1 μm or more, and the level difference A (μm) and the distance B (μm) have the following relationship:

$$0.03 \leq A < 7.0B^2 - 0.3B + 0.08 \quad (2)$$

The lower limit can be changed to a depth wherein no impurity is intermixed in the emitter region.

(4) In the above-mentioned bipolar device, the side wall layer is made from a silicon nitride film and a silicon oxide film, the distance B is 0.4 μm or less and preferably 0.1 μm or more, and the level difference A (μm) and the distance B (μm) have the following relationship:

$$0.03 \leq A < 0.63B^2 + 0.13B + 0.05 \quad (3)$$

The lower limit can be changed to a depth wherein no impurity is intermixed in the emitter region.

(5) In the above-mentioned bipolar device, the side wall layer is made from a silicon nitride film, the distance B is 0.4 μm or less (and preferably 0.1 μm or more), and the level difference A (μm) and the distance B (μm) have the following relationship:

$$0.03 \leq A < 1.25B^2 - 0.5B + 0.01 \quad (4)$$

The lower limit can be changed to a depth wherein no impurity is intermixed in the emitter region.

(6) In the above-mentioned bipolar device, the distance B between the side wall layer and the device isolation film is 0.3 μm or less (and preferably 0.1 μm or more), the side wall layer is made from a silicon oxide film in contact with the level difference and a silicon film in contact with the emitter electrode, and the level difference A in terms of μm has the following relation to the distance B:

$$0.03 \leq A < 7.0B^2 - 0.3B + 0.08 \quad (2)$$

The lower limit can be changed to a depth wherein no impurity is intermixed in the emitter region.

(7) In the above-mentioned bipolar device, the side wall layer is made from a silicon oxide film, the distance B is in the range of 0.4+0.1 μm, and the level difference A is in the range of 0.03 μm to 0.06 μm.

(8) In the above-mentioned bipolar device, the side wall layer is made from a silicon oxide film preferably in contact with the level difference and a silicon film preferably in contact with the emitter electrode, the distance B is in the range of 0.2+0.1 μm, and the level difference A is in the range of 0.03 μm to 0.1 μm.

(9) In the above-mentioned bipolar device, the side wall layer is made from a silicon oxide film and a silicon nitride film, the distance B is in the range of 0.3±0.1 µm, and the level difference A is in the range of 0.03 to 0.1 µm.

(10) In the above-mentioned bipolar device, the side wall layer is made from a silicon nitride film, the distance B is in the range of 0.4±0.1 µm, and the level difference is in the range of 0.03 to 0.06 µm.

According to the present invention, the problem of easily degradable electric characteristics caused by contamination of the surface of the emitter region with a reverse conductivity type impurity is solved by removing a slight portion of the emitter region so as to make an advantageous level difference (A) between the level of the contact area between the base electrode and the base region in the silicon substrate, and the level of the contact area between the emitter electrode and the emitter region in the silicon substrate.

Contamination of the emitter region with the reverse conductivity type impurity occurs mainly at the time of deposition of an interlaminar insulating film after the deposition of base electrode containing a high concentration (e.g. $10^{20}$ atom/cm$^3$) of the reverse conductivity type impurity such as boron. Since heating at high temperatures is required at the deposition of the interlaminar insulating film, the reverse conductivity type impurity contained in the base electrode diffuses into that portion of the silicon substrate which later becomes the emitter region. The impurity penetrates from the surface of silicon substrate into the inner portion thereof. Thus, by removing only the emitter region from the surface of silicon substrate, so as to take away the area where the reverse conductivity type impurity have penetrated, and thus forming a level difference, it is possible to suppress degradation of electric characteristics.

But when the size of level difference becomes too large, the stress at an end portion of the side wall layer which is in contact with the silicon substrate increases, causing a physical dislocation of the silicon substrate and degrading the electric characteristics of bipolar device. Therefore, it is necessary to limit the level difference A in the range of 0.03 µm to 0.1 µm.

According to the study of the present inventors, one factor which determines the stress at the end portion of the side wall layer which is in contact with the silicon substrate is a compression stress field caused by oxidation stress within the device isolation film (thermal oxidation film). When the layout is reduced and the horizontal distance B from the device isolation film to the side wall is reduced in order to realize high integration, since the stress field caused by the thermal oxidation film approaches the side wall layer, the stress at the end portion of side wall layer in contact with the silicon substrate increases so as to easily bring about a dislocation. If the reduction of distance between the device isolation film and the side wall is necessary in order to achieve a high integration, it becomes necessary to limit other parameters.

Further, since the side wall layer is bounded by the base electrode and the interlaminar insulating film, bending stress is generated at another end portion of the side wall layer by making the end portion of the side wall layer having a right angle a fulcrum. This bending stress increases with an increase of the size of level difference A. Therefore, by limiting the size of the level difference to a certain range, the stress at the end portion of side wall layer, which is in contact with the silicon substrate, can be suppressed to a low level. That is, according to the above-mentioned means, since resolved shear stress can be lowered in the area in the silicon substrate wherein stresses in the bipolar device are focused, that is, at the end portion of the side wall layer which separates the emitter electrode and the base electrode, the generation of a dislocation at the end portion of side wall in contact with the silicon substrate can be prevented.

Another factor which affects the stress at an end portion of the side wall layer is an internal stress possessed by the side wall. The internal stress of side wall layer per se (a combination of thermal stress and intrinsic stress) generates a stress at an end portion thereof, that is, at the interface of different materials of the side wall layer and other portion. Thus, by properly selecting the material for the side wall layer, it is possible to reduce the resolved shear stress at the end portion of the side wall layer, which contacts the silicon substrate. By constructing the side wall with a material such as silicon nitride, silicon oxide, silicon, a combination thereof which can reduce the internal stress, it is possible to suppress the resolved shear stress at the end portion of the side wall layer which contacts the silicon substrate to a value which is lower than the dislocation generating critical stress.

On the other hand, when the level difference A is too small, the removal of the contaminated reverse conductivity type impurity is insufficient, and the electric characteristics of the device become unstable. As mentioned above, when the level difference A is too large, dislocation of parts takes place to worsen the electric characteristics. Therefore, by confining the level difference to a proper range, so as to remove the reverse conductivity type impurity and to prevent the dislocation of parts, (that is, from a depth wherein no impurity is intermixed in the emitter region up to 0.1 µm, preferably in the range of 0.03 µm to 0.1 µm), there can be obtained a bipolar device which exhibits a small leakage current, even if the integration of semiconductor device is increased, and has good electric characteristics.

Such a bipolar device can be produced by the steps of:

forming a buried layer on a silicon substrate, followed by formation of a low-concentration p- or n-type layer;

forming a device isolation layer on the silicon substrate by thermal oxidation;

depositing a base electrode and an interlaminar insulating film on a base region in the silicon substrate;

forming an opening by partly removing the base electrode and the interlaminar insulating film, followed by removal of a predetermined amount of the silicon substrate in the opening, so as to form a level difference finally, and formation of a genuine base layer by ion implantation or thermal diffusion method;

forming a side wall layer at a side wall of the opening;

forming an outer base layer in the silicon substrate by heat treatment using the base electrode as an impurity source;

forming an emitter region on the base region by ion implantation and subsequent heat after the formation of a polycrystalline silicon film;

forming an emitter electrode on the emitter region; and forming a collector electrode in contact with the buried layer.

In the above-mentioned process, it is preferable to use as parameters the horizontal distance (B) between the side wall layer and the device isolation film, the internal stress and Young's modulus of the material of side wall layer, and/or the level difference (A) of the contact area level between the base electrode and the base region in the silicon substrate, and the contact area level between the emitter electrode and the emitter region in the silicon substrate to obtain shear stress in the shift direction on the shift plane in the silicon substrate by numerical analysis (analysis by the finite element method), and to make the individual parameter values lower than the dislocation generating limit.

The present invention is explained more in detail referring to drawings.

Figure 2:
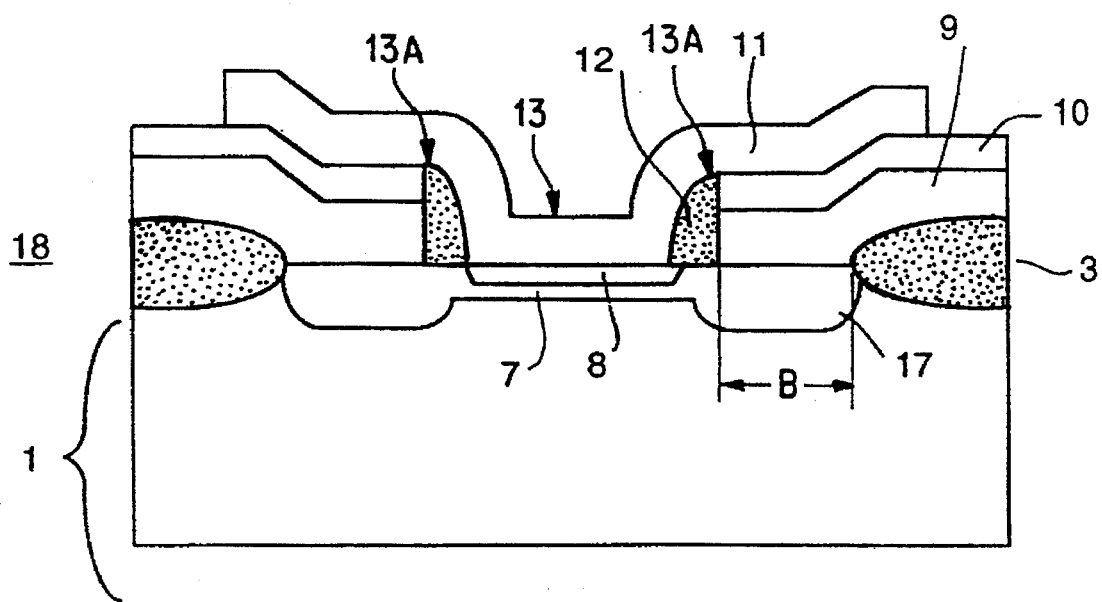
FIG. 2 is a cross sectional view of main portions of a prior art bipolar device.
Figure 12:
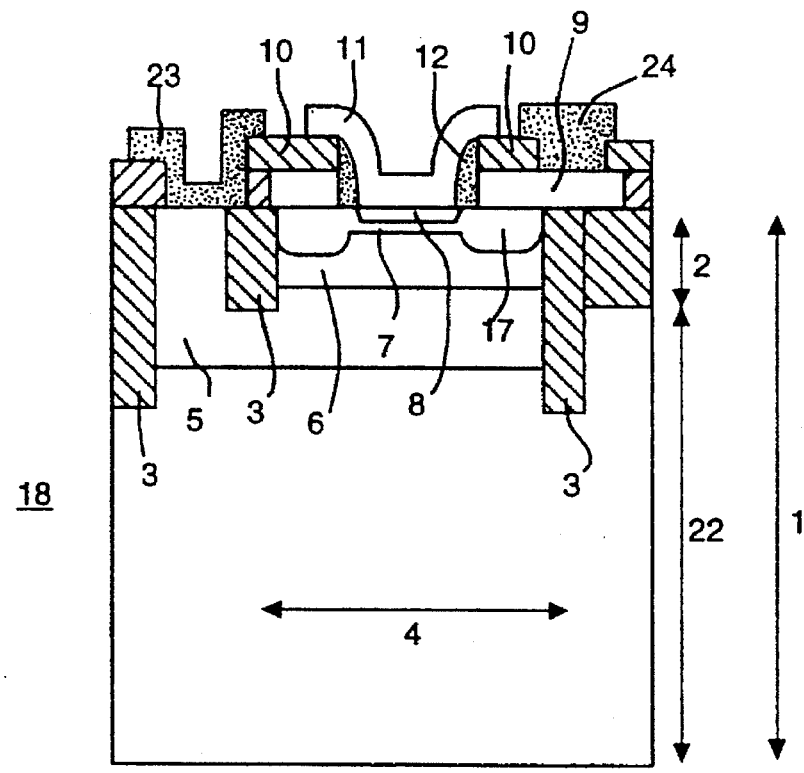
FIG. 12 is a cross sectional view of main portions of a bipolar device according to prior art.
Figure 13:
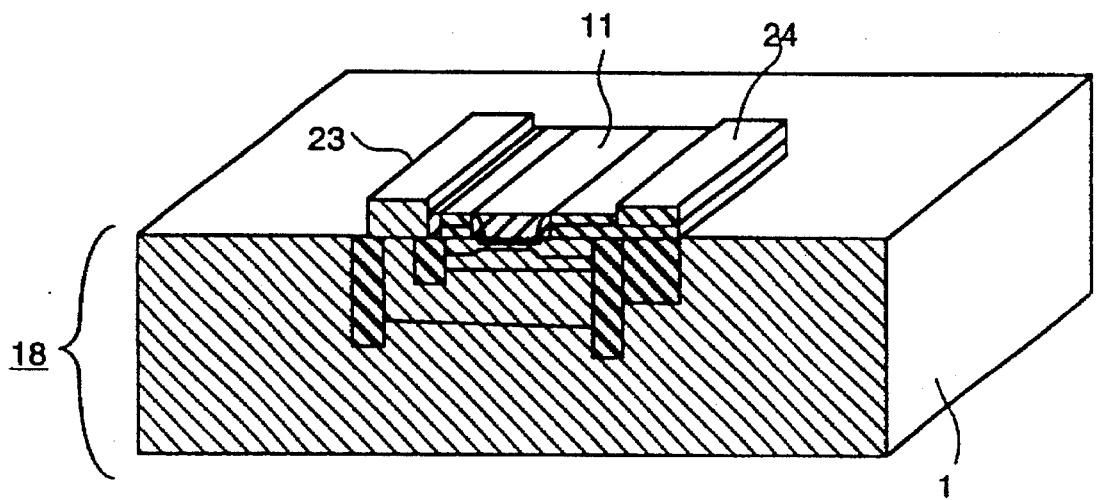
FIG. 13 is a schematic and partially cross sectional view of the bipolar device of FIG. 12.

FIG. 12 is an enlarged cross sectional view of main portions of a prior art bipolar device 18. Numeral 22 denotes a bottom portion of silicon substrate of a reverse conductivity type, numeral 1 denotes a silicon substrate, numeral 2 denotes an epitaxial growth layer of a reverse conductivity type, numeral 3 denotes a device isolation film, numeral 4 denotes an active area, numeral 5 denotes a monoconductivity type high concentration buried layer, numeral 6 denotes a monoconductivity low concentration layer, numeral 7 denotes a base region of a reverse conductivity type, numeral 8 denotes an emitter region of a monoconductivity type, numeral 9 denotes a base electrode containing a high concentration of a reverse conductivity type impurity, numeral 10 denotes an interlaminar insulating film, numeral 11 denotes an emitter electrode, numeral 12 denotes a side wall layer made from a silicon oxide film, numeral 17 denotes an outer base region of a reverse conductivity type, numeral 23 denotes a collector electrode, and numeral 24 denotes a base wiring. Hereinafter, the silicon substrate 1 can refer to all of the epitaxial growth layer 2, the high concentration buried layer 5, the low concentration layer 6, the base region 7, the emitter region 8, and the outer base region 17. FIG. 2 is an enlarged cross sectional view of the active area which is a major portion of the bipolar device. FIG. 13 is a schematic and partially cross sectional view of a bipolar device. The cross sectional portion of FIG. 13 corresponds to each cross section of FIG. 12 and other drawings hereinafter referred to.

The active area in the bipolar device shown in FIG. 2 can be formed as follows. First, a base electrode 9 containing a high concentration (e.g. $10^{20}$ atom/cm$^3$) of a reverse conductivity type impurity (e.g. boron, etc.) and an interlaminar insulating film 10 (e.g. a silicon oxide film) are deposited on the surface of silicon substrate 1 in the active area 4, followed by selective removal of the base electrode 9 and the interlaminar insulating film 10 using a conventional photoresist film as a mask to form an opening 13 defined by peripheral walls 13A.

After depositing a silicon oxide film further, a side wall layer 12 made from the silicon oxide film is formed on the wall 13A which forms the periphery of the opening 13, as shown in FIG. 1. (Herein, the wall 13A which forms the periphery of the opening 13 is referred to as a "side wall", while the silicon oxide film 12 formed thereon is referred to as the "side wall layer".) Then, using the side wall layer 12 and the interlaminar insulating film 10 as a mask, a reverse conductivity type impurity (e.g. boron up to $10^{12}$/cm$^2$ (dose)) and subsequently a monoconductivity type impurity (e.g. arsenic up to $10^{16}$/cm$^2$ (dose)) are implanted by ion implantation. Finally, the heat treatment is conducted to form a base region 7 and an emitter region 8, followed by formation of an emitter electrode 11 so as to contact with the emitter region 8.

In the above-mentioned prior art process, there was a problem in that electric characteristics are easily degraded due to contamination of a reverse conductivity type impurity in addition to the monoconductivity impurity constituting the emitter region 8 on the surface thereof.

The present inventors found that when, in order to improve the integration of device, the size of the bipolar device 18 as shown in FIG. 1 was reduced and the distance B between the side wall layer 12 and the device isolation film 3 was made 0.4 μm or less, a number of defective devices were produced, wherein current leakage between the emitter and the collector was abnormally increased. By the analysis using a transmission electron microscope, it was found that a dislocation was caused in the silicon substrate 1 starting from an end of the side wall layer 12, and this dislocation traversed the emitter and the collector to generate current leakage. It is known that such a dislocation is caused when the shear stress component (resolved shear stress component) on the {111} crystal plane of silicon crystal is above the critical value. In order to prevent dislocation of the silicon substrate 1 in the internal portion of the bipolar device 18 and to make electric characteristics of bipolar device better, it is necessary to suppress the resolved shear stress component in the silicon substrate 1 to a level which is below the critical value.

Further, when the size of individual bipolar devices 18 is reduced in order to improve the integration of the bipolar device 18, the tendency to generate a dislocation increases, since stress concentrated fields caused by residual stress of each thin film are multiplied to enlarge the stress. Thus, it is necessary to provide a bipolar device having a structure which does not make the generated stress too large, even when the integration of the bipolar device 18 is improved.

The above-mentioned problem can be solved by making the contacting interface between the emitter electrode 11 and the emitter region in the silicon substrate 1 properly lower than the contacting interface between the base electrode 9 and the base region in the silicon substrate 1, as shown in FIG. 1. That is, by provident a "level difference" 14 (designated as A in FIG. 1) having a proper size between the contact area of the base electrode 9 and the silicon substrate 1 and the contacting area of the emitter electrode 11 and the silicon substrate 1, it becomes possible to solve the problem. (As noted previously, the term "silicon substrate 1" includes the epitaxial growth layer, the high concentration buried layer, the low concentration layer, the base region 7 and the emitter region 8.)

The problem of easily degrading the electric characteristics due to contamination of the surface of the emitter region 8 with the reverse conductivity type impurity can be resolved by removing a slight portion of the emitter region, thereby creating the level difference 14 in a proper size (as discussed hereafter) between the contact area of the base electrode 9 and the silicon substrate 1 on the one hand, and the contact area of the emitter electrode 11 and the silicon substrate 1 on the other.

Figure 3:
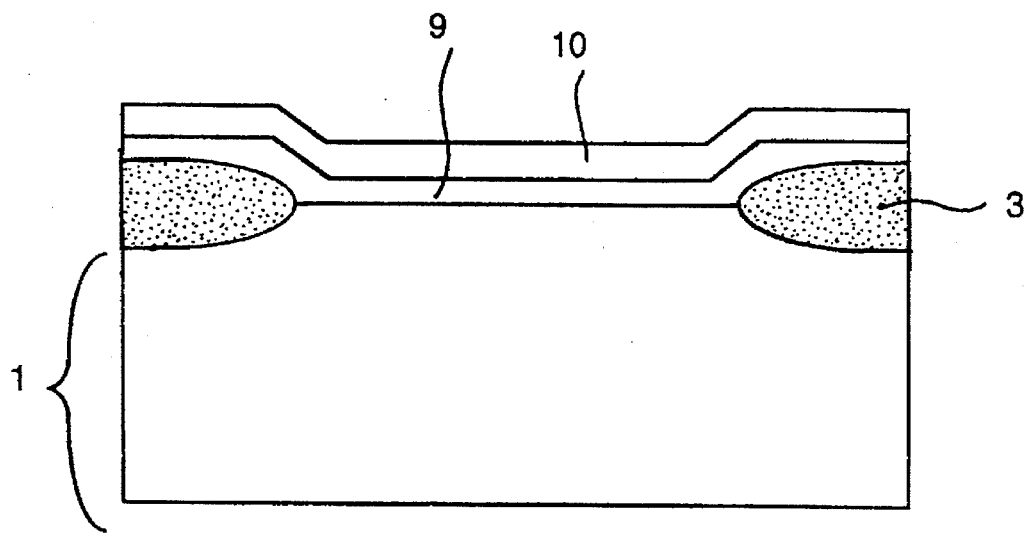
FIG. 3 is a cross sectional view of a silicon substrate in the course of production of a bipolar device for explaining problems of the bipolar device.
Figure 4:
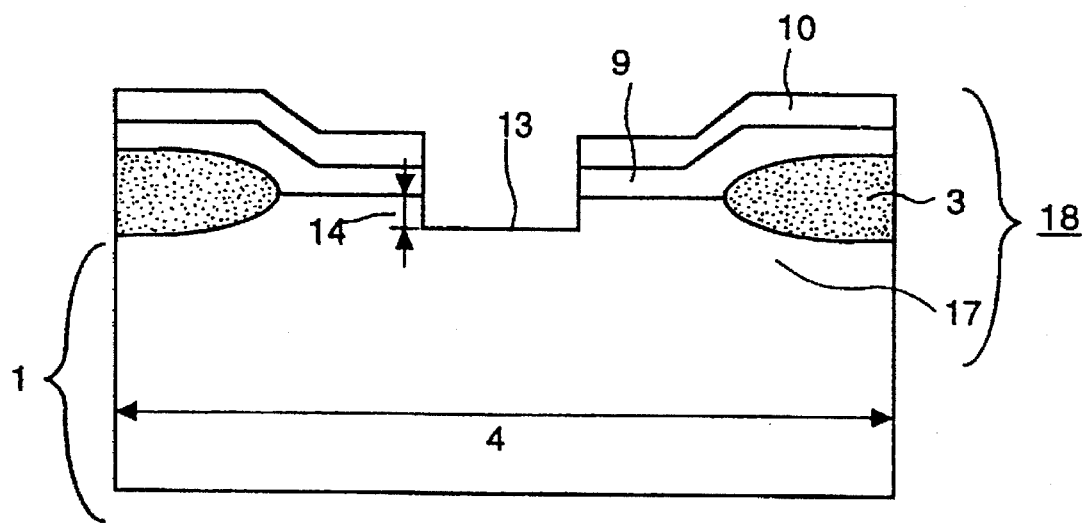
FIG. 4 is a cross sectional view of main portions for explaining the fabrication process for the bipolar device according to Example 1 of the present invention.

The contamination of the emitter region with the reverse conductivity type impurity takes place at the time of deposition of the interlaminar insulating layer 10 after the deposition of the base electrode 9 containing the reverse conductivity type impurity in high concentration as shown in FIG. 3. Since heating at a temperature of about 600° C. to 900° C. is necessary for depositing the interlaminar film 10 (e.g. silicon oxide film), the reverse conductivity type impurity contained in the base electrode 9 diffuses into the portion which becomes the emitter region 8 later. This impurity diffuses from the surface of the silicon substrate 1 and penetrates into the inner portion. Thus, only the emitter region is removed from the surface of silicon substrate 1, for example by etching, so as to eliminate the area contaminated with the reverse conductivity type impurity and to form the level difference 14, resulting in suppressing the change in electric characteristics. (See FIG. 4.)

But, the mere formation of the level difference 14 as such is not sufficient. That is, when the size of the level difference 14 is too large, the stress at the end of side wall layer 12 in contact with the silicon substrate increases to cause a dislocation of the parts of the device, resulting in deteriorating electric characteristics of the bipolar device 18. Therefore, it is necessary to limit the level difference to the range of 0.03 to 0.1 μm.

In order to reduce the stress at the end portion of the side wall layer, which is in contact with the silicon substrate, the present inventors also investigated mechanisms for generating the stress using numerical calculations. As a factor for deciding the stress at the end portion of side wall layer 12 in contact with the silicon substrate, there is an influence of the stress field of compression stress caused by oxidation stress in the device isolation film (thermal oxidation film) 3.

On the other hand, the method of stress analysis can be carried out as follows. As parameters, the distance B between the side wall layer 12 and the device isolation film 3, the internal stress and Young's modulus of the material for the side wall layer 12, and the level difference A between the contact area level of the base electrode and the silicon substrate, and the contact area level of the emitter electrode and the silicon substrate are measured. Then, the shear stress in the shift direction in the shift plane in the silicon substrate is subjected to numerical analysis (by the finite element method).

The thus obtained shear stress can be expressed in a stress distribution chart (or diagram) using at least the distance between the side wall layer 12 and the device isolation film 3 as a parameter.

According to the present invention, there is also provided an information communicating and storage means which has a display device relating to the structure of the bipolar device mentioned above, and is a medium such as paper, magnetic disc, optical disc, magnetooptical disc, etc., wherein at least the distance between the side wall layer 12 and the device isolation film, the internal stress and Young's modulus of material for the side wall layer 12, and the level difference between the contact area of the base electrode and the silicon substrate, and the contact area level of the emitter electrode and the silicon substrate are written as parameters, and the area wherein dislocation is estimated to occur is indicated.

The present invention is illustrated by way of the following Examples referring to attached drawings wherein FIGS. 1, 3, 4, 5 and 8 are enlarged cross sectional views showing the structure of the active area 4 of bipolar device of the present invention.

EXAMPLE 1

FIG. 1 is a cross sectional view of main portions of a bipolar device 18. In FIG. 1, numeral 1 denotes a silicon substrate, numeral 3 denotes a device separation film, numeral 7 denotes a base region of a reverse conductivity type, numeral 8 denotes an emitter region of monoconductivity type, numeral 9 denotes a base electrode containing a reverse conductivity type impurity in high concentration, numeral 10 denotes an interlaminar insulating film, numeral 11 denotes an emitter electrode, and numeral 12 denotes a side wall layer made from a silicon oxide film. The base electrode 9 is placed in contact with the device isolation film 3. The emitter region 8 is separated from the base region 7 by the side wall layer 12.

As shown in FIG. 1, the bipolar device has a structure which includes a level difference 14 between the contact area of the emitter electrode 11 with the silicon substrate 1, and the contact area of the base electrode 9 with the silicon substrate 1. (In other words, the contact area of the emitter electrode 11 with the silicon substrate 1 is removed.) As the silicon substrate 1, it is possible to use a substrate having a silicon on insulator (SOI) structure. When a substrate having SOI structure is used, there is a tendency to increase stress at individual portions. In such a case, the present invention is particularly effective.

The device isolation film 3 is constituted by a silicon oxide film, preferably thermally oxidized film. The base electrode 9 and the emitter electrode 11 are constituted by a conductive film, preferably made from a polycrystalline silicon film, a tungsten film, a tungsten-silicide film, a single crystal silicon film, or amorphous silicon film. The interlaminar insulating film 10 is made from either a silicon oxide film or a silicon nitride film. The side wall layer 12 is made from a silicon oxide film, preferably formed by a chemical vapor deposition (CVD) method using an inorganic silane as a raw material.

The bipolar device 18 is produced as follows. First, on the surface of an active area 4 shown in FIG. 4, the base electrode 9 (polysilicon) containing a reverse conductivity type impurity (boron) in high concentration (about $10^{20}$/cm$^3$) and the interlaminar insulating film (silicon oxide) 10 are deposited. (See also FIG. 3.) Then, the base electrode 9 and the interlaminar insulating film 10 are selectively removed using a photoresist film as a mask to form an opening 13 having side walls 13A. Next, the silicon substrate 1 containing impurities up to $10^{15}$/cm$^3$ at the opening 13 is locally etched to form a level difference 14. The size of the level difference 14 is determined, within the range of 0.03 μm to 0.1 μm, to remove the reverse conductivity impurity from the silicon substrate surface and to avoid dislocation of the silicon substrate 1. Then, a reverse conductivity type impurity (boron, up to $10^{12}$/cm$^2$) is implanted into the opening by a thermal diffusion method or ion implantation method to form a part of base region (genuine base region).

Figure 5:
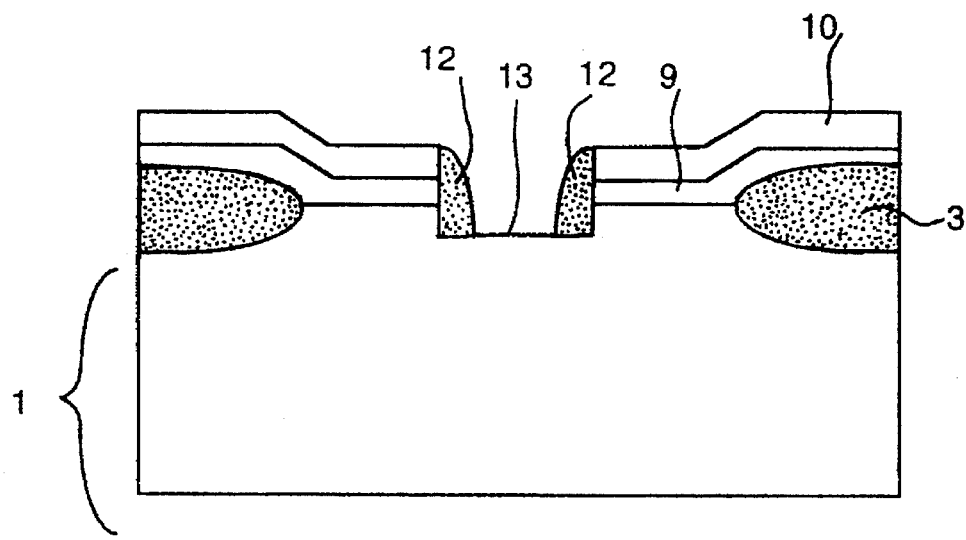
FIG. 5 is a cross sectional view of main portions for further explaining the fabrication process of bipolar device according to Example 1 of the present invention.

After depositing a silicon oxide film, a side wall layer 12 made from a silicon oxide film is formed at a side wall 13A of the opening 13 by etching back as shown in FIG. 5. Then, a heat treatment is conducted to diffuse the base electrode 9 containing the reverse conductivity type impurity as an impurity source, and to form a part of base region (outer base region). After depositing a silicon film uniformly, using the side wall layer 12 and the interlaminar insulating film 10 as a mask, a monoconductivity type impurity (arsenic, phosphorus, etc. up to $10^{16}$/cm$^2$) is implanted in the opening 13 by ion implantation. Then, the emitter region 8 as shown in FIG. 1 is formed by heat treatment. Further, by etching the silicon film, the emitter electrode 11 is formed in contact with the emitter region 8.

In the above-mentioned process, when the interlaminar insulating film 10 is deposited after the deposition of the base electrode 9 containing the reverse conductivity type impurity in high concentration as shown in FIG. 3, the emitter region is contaminated with the reverse conductivity type impurity. The presence of such an impurity cannot be ignored when an improvement of integration of the bipolar device is to be achieved. That is, with an improvement of integration, the stress value at each stress concentration field increases. By the presence of such a stress field, these impurities are captured and show a distribution depending on the stress field.

Further, with the reduction of the width of the device, the distribution influences properties of the device. Thus, removal of the impurity that is intermixed at the time of deposition of the interlaminar insulating film 10 (see FIG. 1) is absolutely necessary for the bipolar device wherein the distance B from the side wall layer 12 to the device isolation film 3 is 0.4 μm or less. For example, when the interlaminar insulating film 10 is deposited at about 600° C. to 900° C. and polysilicon containing a large amount of boron is used as a base electrode 9, the boron diffuses up to 0.03 μm in depth during the deposition of the interlaminar insulating layer 10. In order to remove this reverse conductivity type impurity, it is necessary to remove the silicon substrate in 0.03 μm or more so as to form the level difference 14.

When the level difference 14 is deeper than the peak concentration depth of the reverse conductivity type impurity in the base region 7, and a bipolar device 18 is produced by simply reducing the width, dislocation is frequently generated from the end portion of the side wall layer 12 in contact with the silicon substrate very often, resulting in failure to produce the bipolar device 18 having good electric characteristics. This means that the resolved shear stress at the end portion of side wall layer 12 in contact with the silicon substrate is beyond the dislocation generating critical stress.

The resolved shear stress at the end portion of side wall layer 12 in contact with the silicon substrate is greatly influenced by three parameters, namely: physical properties of the material for the side wall layer 12, the size A of the level difference 14 between the contact area of the base electrode 9 with the silicon substrate 1 and the contact area of the emitter electrode 11 with the silicon substrate 1, and the distance B from the device isolation film 3 to the side wall layer 12. That is, the device isolation film 3 is formed by thermal oxidation of the silicon substrate. Since a volume expansion of 1.25 times takes place at this time, there is generated a large compressive residual stress. Therefore, with a decrease of the distance from the device isolation film 3 to the side wall layer 12, the influence of compressive stress of the device isolation film 3 becomes substantial and the resolved shear stress at the end portion of the side wall layer 12 in contact with the silicon substrate increases.

Further, the material such as silicon oxide constituting the side wall layer 12 has a higher Young's modulus, a large intrinsic stress generated at the time of film formation, and provides a larger strain to the silicon substrate when the shrinkage after heat treatment is larger, so that the resolved shear stress generated at the end portion of side wall layer 12 in contact with the silicon substrate increases. Further, when the size of the level difference 14 is larger, the bending stress generated at another end of the side wall layer 12 increases when the end portion of the side wall layer 12 having a right angle is taken as a fulcrum.

Figure 6:
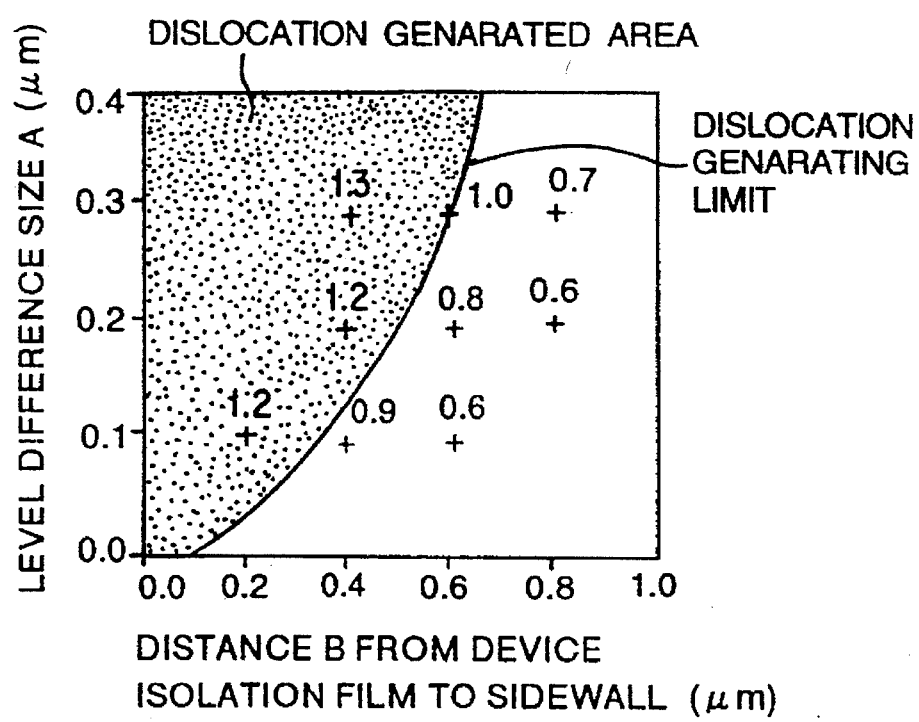
FIG. 6 is a diagram showing a dislocation generating area, used for explaining a structure not generating dislocation.

Thus, when the stress analysis is conducted by the finite element method using these parameters and compared with the dislocation generating critical stress, optimalization can be attained. FIG. 6 shows resolved shear stress values at end portion of side wall layer 12 in contact with the silicon substrate when taken the level difference A along the ordinate axis and the distance B from the device isolation film 3 to the side wall layer 12 along the abscissae axis when the side wall layer 12 is formed by silicon oxide using inorganic silane as a raw material, using the CVD method.

In FIG. 6, the stress values are shown by the rated values taking the dislocation generating critical stress as 1. The dislocation generating limit can be expressed by a quadratic equation using the above-mentioned A (μm) and B (μm) as follows:

$$A = 1.25B^2 - 0.35B + 0.06 \quad (1)$$

When the upper limit of the level difference 14 was selected so as to be outside the dislocation generating area (FIG. 6), no dislocation at the end portion of side wall layer 12 in contact with the silicon substrate took place and bipolar devices having good electric characteristics were produced.

For example, when the distance B from the device isolation film 3 to the side wall layer 12 was taken in the range of 0.4+0.1 μm taking the production deviation into consideration, and the level difference A was taken in the range of 0.03 μm to 0.06 μm also taking the production deviation into consideration, good bipolar devices were obtained. When the size of bipolar devices 18 was reduced by 20% and the size of level difference 14 was determined so as to be outside the dislocation generating limit shown by the above equation (1) (and in FIG. 6), the resulting bipolar devices did not generate dislocation and showed good electric characteristics, even if the bipolar devices were reduced in size to attain higher integration of semiconductor devices.

Figure 7:
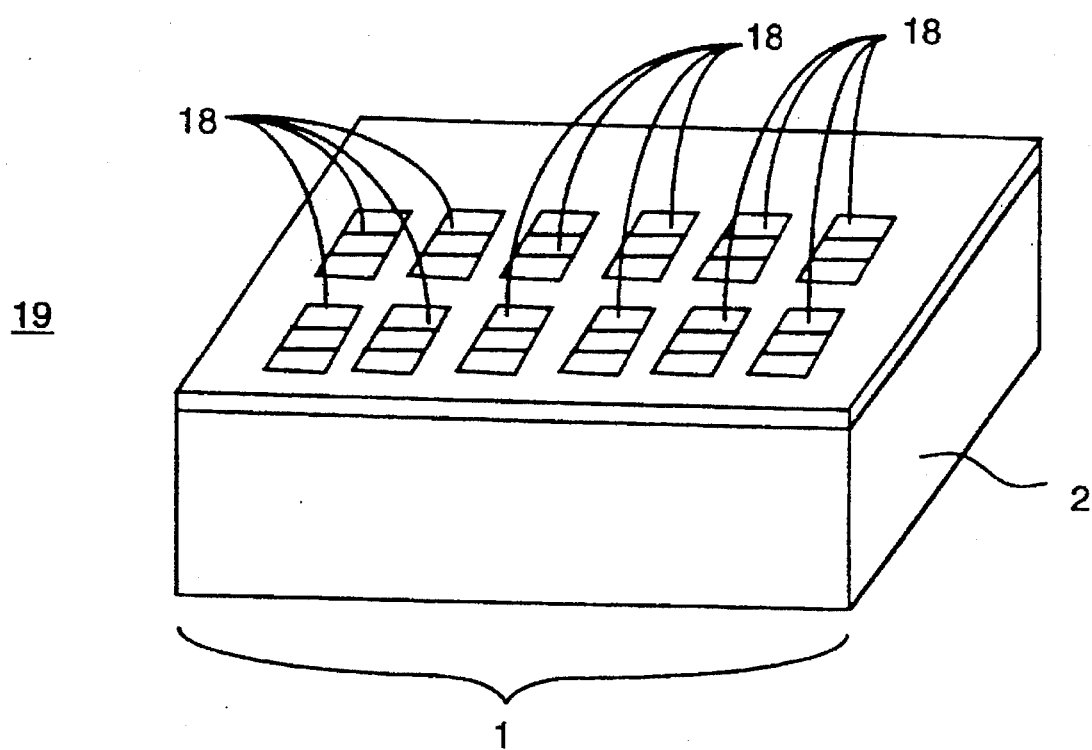
FIG. 7 is a schematic view showing a relation between each bipolar device and a semiconductor device.

FIG. 7 shows a semiconductor device 19 mounting a large number of bipolar devices 18 on a silicon substrate 1. If even one of the bipolar devices on the semiconductor device 19 undergoes a dislocation, the behavior of the semiconductor device 19 becomes incomplete. Therefore, all the bipolar devices 18 on the semiconductor device 19 should have the level difference 14 in the predetermined range (e.g. 0.03 μm to 0.1 μm) so as to prevent completely the generation of dislocation.

Since there is a deviation in the etching speed in the semiconductor device 19, level differences 14 larger than the predetermined size can easily be formed in some bipolar devices 18 due to faster etching speed at the completion of the etching of all the bipolar devices in the semiconductor device 19. Therefore, even if the size of the level difference 14 may vary in the semiconductor device 19, such a deviation should be limited to the range not generating the dislocation.

EXAMPLE 2

The process of Example 1 was repeated except for using an organic silane in place of the inorganic silane for forming the side wall layer 12 with a silicon oxide film by CVD method. The side wall layer was contaminated with a trace amount of carbon atoms.

As a result, bipolar devices having the same good electric characteristics as in Example 1 were obtained.

EXAMPLE 3

Figure 8:
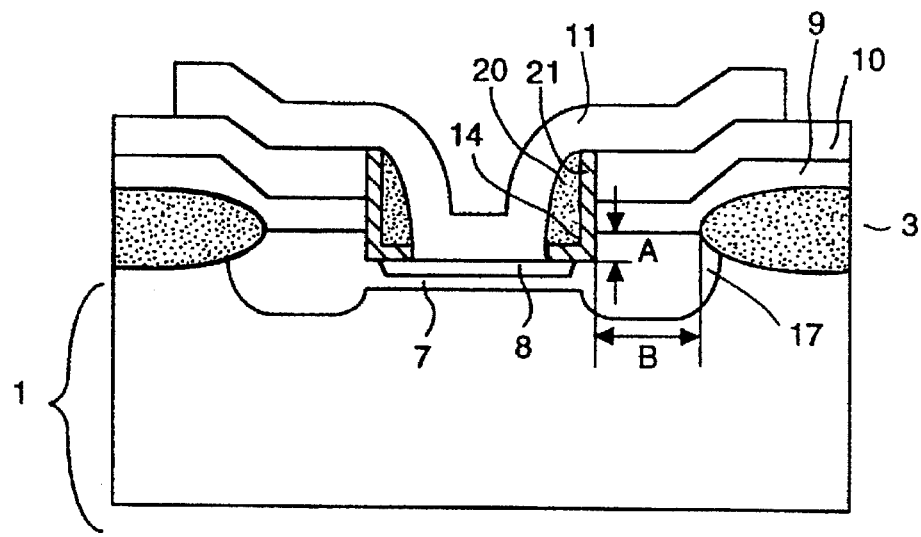
FIG. 8 is a cross sectional view of main portions of a bipolar device according to the invention, as described in Example 3 or Example 4.

FIG. 8 shows another example of the bipolar device (main portions being shown) wherein the side wall layer comprises an upper portion 20 made from a silicon film, and a lower portion 21 made from a silicon oxide film by means of the CVD method, preferably by using an inorganic silane as a main starting material. The upper portion 20 of the side wall layer 12 is constructed by polycrystalline silicon, amorphous silicon or single crystal silicon obtained by using a silane as a starting material and the CVD method. The thickness of the lower portion 21 is preferably in the range of 0.03 μm to 0.08 μm.

Figure 9:
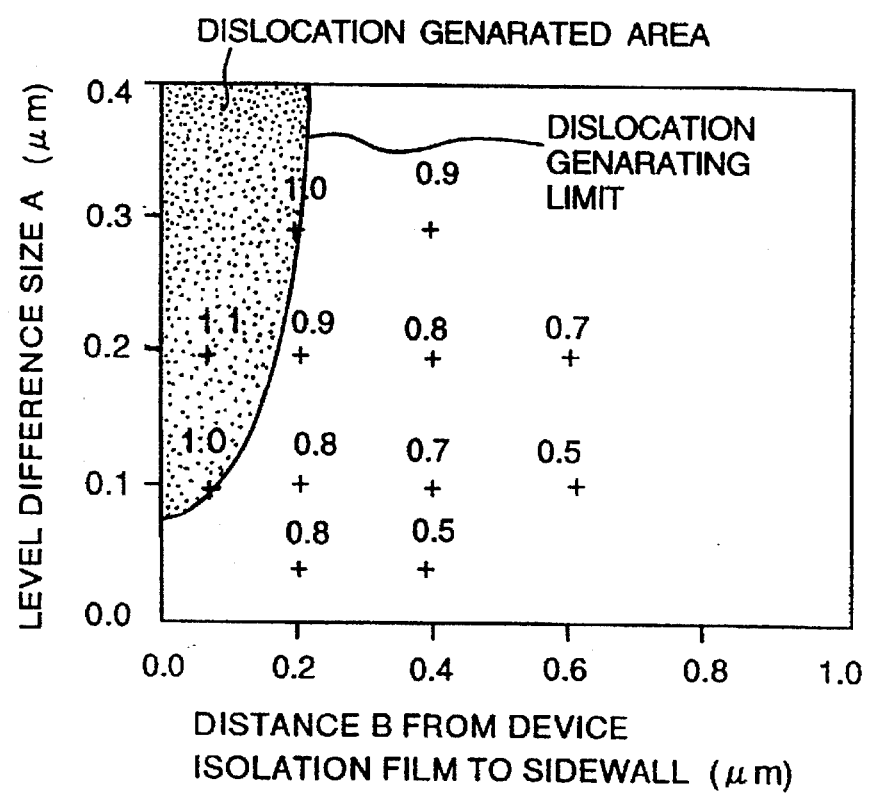
FIG. 9 is a diagram showing a dislocation generating area, used for explaining a structure not generating dislocation.

FIG. 9 shows resolved shear stress values at the end portion of the side wall layer 12 in contact with the silicon substrate when taken the level difference A along the ordinate axis and the distance B from the device isolation film 3 to the side layer 12 along the abscissae axis. FIG. 9 shows ratios of the dislocation generating critical stress, comparing the resolved shear stress at the end portion of each level difference 14 with the dislocation generating critical stress as in Example 1.

The level difference A (μm) has the following relation to the distance B (μm):

$$A < 7.0B^2 - 0.3B + 0.08 \tag{2}$$

By selecting the size of the level difference using the above equation, dislocation of the substrate 1 can be prevented. Further, by making the level difference 14 0.03 μm or more so as to remove the reverse conductivity type impurity other than the monoconductivity type impurity constituting the emitter region 8, the degradation of electric characteristics can be prevented.

For example, when the distance B from the device isolation film 3 to the side wall layer 12 is in the range of 0.2±0.1 μm taking the production deviation into consideration, and the level difference A is in the range of 0.03 μm to 0.1 μm from FIG. 9 also taking the production deviation into consideration, good bipolar devices were obtained.

According to the present invention, the side wall layer 12 comprises a portion of the silicon oxide film in contact with the level different portion, and a portion of the silicon film in contact with the emitter electrode. That is, since the interface between the emitter electrode and the side wall does not become a different material interface, the specificity is weakened and stress concentration can be reduced. Therefore, even when high integration is conducted, the generation of dislocation can be prevented. As a result, there can be obtained a bipolar device having high reliability.

Further, by reducing the distance from the side wall layer to the device isolation film 3 to 0.3 μm or less, since the area of base electrode on the silicon substrate can be further reduced, smaller chips can be obtained, compared with the case where the distance from the side wall to the device isolation film 0.4 μm or less.

EXAMPLE 4

This Example provides a further example of the bipolar device, wherein the upper portion 20 of side wall layer 12 is made from a silicon nitride film, and the lower portion 21 is made from a silicon oxide film (see FIG. 9), preferably using an inorganic silane as a main starting material, and the CVD method. The upper portion 20 is constructed by a silicon nitride film obtained by using a silane as a main starting material and the CVD method. The thickness of the lower portion 21 is preferably in the range of 0.03 μm to 0.08 μm.

Figure 10:
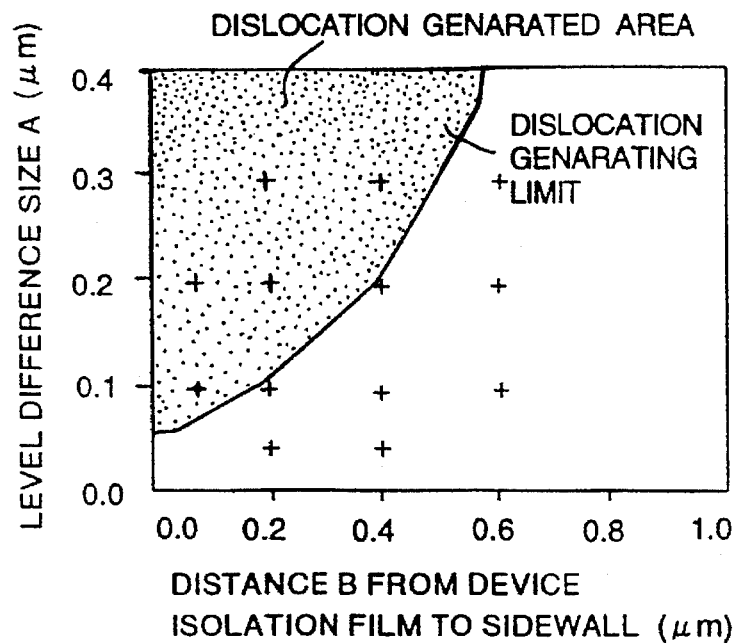
FIG. 10 is a diagram showing a dislocation generating area, used for explaining a structure not generating dislocation.

FIG. 10 shows resolved shear stress values at the end portion of the side wall layer in contact with the silicon substrate as a function of the level difference A along the ordinate axis and the distance B from the device isolation film 3 to the side wall layer 12 along the abscissae axis. FIG. 10 shows ratios to the dislocation generating critical stress comparing the resolved shear stress at the end portion for each level difference 14 with the dislocation generating critical stress as in Example 1.

The level difference A (μm) has the following relation to the distance B (μm):

$$A < 0.63B^2 + 0.13B + 0.05 \tag{3}$$

By selecting the size of the level difference using the above equation, the dislocation of the substrate 1 can be prevented. Further, by making the level difference 14 0.03 μm or more so as to remove the reverse conductivity type impurity other than the monoconductivity type impurity constituting the emitter region 8, the degradation of electric characteristics can be prevented.

For example, when the distance B from the device isolation film 3 to the side wall layer 12 is in the range of 0.3±0.1 μm taking the production deviation into consideration, and the level difference A is in the range of 0.03 μm to 0.1 μm from FIG. 10, also taking the production deviation into consideration, good bipolar devices were obtained.

EXAMPLE 5

This Example provides a still further example of the bipolar device, wherein the side wall layer 12 is made from a silicon nitride film (see FIG. 1), preferably using an inorganic silane as a main starting material, and the CVD method.

Figure 11:
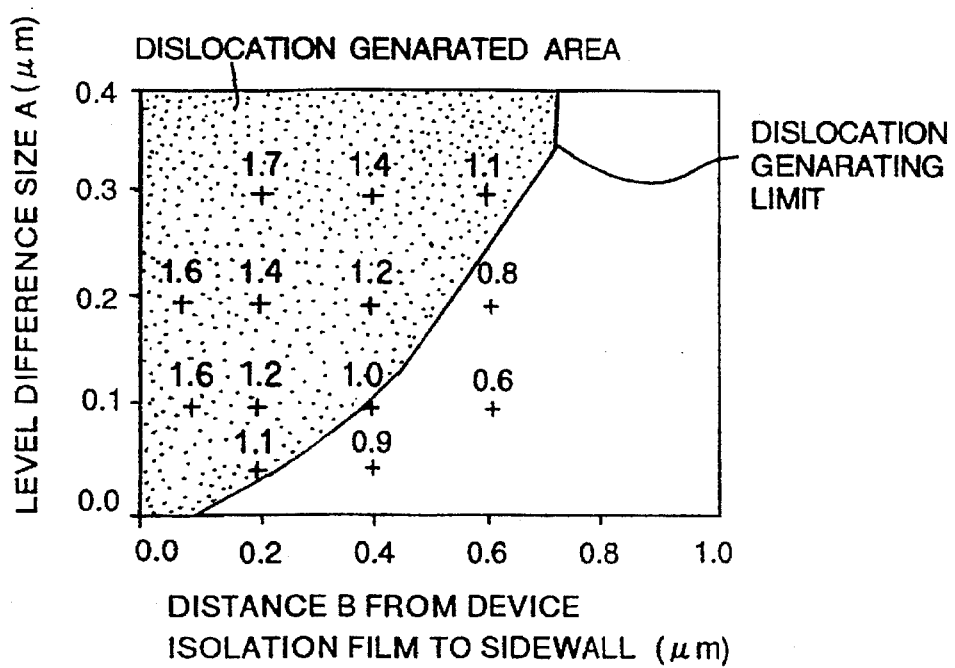
FIG. 11 is a diagram showing a dislocation generating area, used for explaining a structure not generating dislocation.

FIG. 11 shows resolved shear stress values at the end portion of side wall layer 12 in contact with the silicon substrate as a function of the level difference A along the ordinate axis, and the distance B from the device isolation film 3 to the side wall layer 12 along the abscissae axis. FIG. 11 shows ratios of the dislocation generating critical stress, comparing the resolved shear stress at the end portion for each level difference 14 with the dislocation generating critical stress as in Example 1.

The level difference A (μm) has the following relation to the distance B (μm):

$$A < 1.25B^2 - 0.5B + 0.1 \tag{4}$$

By selecting the size of the level difference using the above equation, dislocation of the substrate 1 can be prevented. Further, by making the level difference 14 0.03 μm or more so as to remove the reverse conductivity type impurity other than the monoconductivity type impurity constituting the emitter region 8, the degradation of electric characteristics can be prevented.

For example, when the distance B from the device isolation film 3 to the side wall layer 12 is in the range of 0.4±0.1 μm, taking the production deviation into consideration, and the level difference A is in the range of 0.03 μm to 0.06 μm from FIG. 11, also taking the production deviation into consideration, good bipolar devices were obtained.

The present invention is not limited to the above-mentioned Examples and can be practiced with various modifications. For example, when the monoconductivity type impurity is an n-type impurity and the reverse conductivity type impurity is a p-type impurity, the bipolar device becomes a npn type semiconductor device. On the other hand, when the monoconductivity type impurity is a p-type impurity and the reverse conductivity type impurity is an n-type impurity, the bipolar device becomes a pnp type semiconductor device. Further, the semiconductor substrate is not limited to a silicon semiconductor but can also be applied to a compound semiconductor.

As mentioned above, according to the present invention, since the contact area level of the emitter electrode 11 (in FIG. 1) and the silicon substrate 1 is made sufficiently lower than the contact area level of the base electrode 9 and the silicon substrate 1, intermixture of the reverse conductivity type impurity into the emitter region 8 is prevented so as to suppress the degradation of electric characteristics of the bipolar device 18, achieving a bipolar device 18 having good electric characteristics.

Further, since the resolved shear stress at the end portion of the side wall layer 12 in contact with the silicon substrate (see FIG. 1, etc.) which separates the emitter and the base in the silicon substrate 1, can be reduced, it is possible to obtain a bipolar device 18 which is characterized by a small leakage current and good electric characteristics.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the level difference A is in the range of 0.03 μm to 0.1 μm.

2. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.5 μm, the side wall layer is made from a silicon oxide film, and the level difference A has the following relation to the distance B:

$$0.03 \leq A < 1.25B^2 - 0.35B + 0.06.$$

3. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.4 µm, the side wall layer is made from a silicon oxide film in contact with the level difference and a silicon film in contact with the emitter electrode, and the level difference A has the following relation to the distance B:

$$0.03 \leq A < 7.0B^2 - 0.3B + 0.08.$$

4. A process for producing a bipolar device, which comprises the steps of:

forming a buried layer on a silicon substrate followed by formation of an impurity layer which comprises an impurity selected from the group consisting of a p-type impurity and am n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.4 µm, the side wall layer is made from silicon nitride film and a silicon oxide film, and the level difference A has the following relation to the distance B:

$$0.03 \leq A < 0.63B^2 + 0.13B + 0.05.$$

5. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.4 µm, the side wall layer is made from a silicon nitride film, and the level difference A has the following relation to the distance B:

$$0.03 \leq A < 1.25B^2 - 0.5B + 0.1.$$

6. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.3 µm, the side wall layer is made from a silicon oxide film in contact with the level difference and a silicon film in contact with the emitter electrode, and the level difference A has the following relation to the distance B:

$$0.03 \leq A < 7.0B^2 - 0.3B + 0.08.$$

7. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is in the range of 0.4±0.1 µm, the side wall layer is made from a silicon oxide film, and the level difference A is in the range of 0.03 µm to 0.06 µm.

8. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is in the range of 0.2±0.1 μm, the side wall layer is made from a silicon oxide film in contact with the level difference and a silicon film in contact with the emitter electrode, and the level difference A is in the range of 0.03 μm to 0.1 μm.

9. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is in the range of 0.3±0.1 μm, the side wall layer is made from a silicon oxide film and a silicon nitride film, and the level difference A is in the range of 0.03 μm to 0.1 μm.

10. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is in the range of 0.4±0.1 μm, the side wall layer is made from a silicon nitride film, and the level difference A is in the range of 0.03 μm to 0.06 μm.

11. A process for producing a bipolar device, which comprises the steps of:

forming a buried layer on a silicon substrate followed by formation of an impurity layer which comprises an impurity selected from the group consisting of a p-type impurity and an n-type impurity, and has a concentration of said impurity which is lower than a concentration of said impurity in said buried layer;

forming a device isolation film on the silicon substrate by thermal oxidation;

depositing a base electrode and an interlaminar insulating film on a base region of the silicon substrate;

forming an opening by removing a portion of the base electrode and a portion of the interlaminar insulating film;

forming a level difference A between a first level of contact of the base electrode with the base region of the silicon substrate and a second level of contact of an emitter electrode with an emitter to be formed in said substrate, by removing a portion of the silicon substrate in said opening, whereby side walls of said opening extend into the silicon substrate and a bottom portion of said opening defines said second level of contact of the emitter electrode and the emitter region, the portion of the silicon substrate being removed having a depth sufficient to form said level difference without generating a dislocation of elements of said device during production of said bipolar device;

forming a genuine base layer in a portion of said base region which is situated beneath an area of said substrate wherein said emitter is to be formed, by means of a process selected form the group consisting of ion implantation and thermal diffusion;

forming a side wall layer at side walls of the opening, separated by a distance B from the device isolation film;

forming an outer base layer in the silicon substrate by heat treatment using the base layer as an impurity source;

forming an emitter region on the base region by ion implantation and subsequent heat treatment after formation of a polycrystalline silicon film;

forming a emitter electrode on the emitter region;

forming a collector electrode in contact with the buried layer; and wherein the distance B between the side wall layer and the device isolation film is no greater than 0.3 μm, the side wall layer is made from a silicon oxide film in contact with the level difference and a silicon film in contact with the emitter electrode, and the level difference A extends downward in said silicon substrate to a depth at which no impurity is intermixed in the emitter region and has the following relation to the distance B:

$$A < 7.0B^2 - 0.3B + 0.08.$$

12. Process for manufacturing a vertical bipolar transistor having a base electrode deposited on a silicon substrate over an emitter region of said substrate, in which an emitter layer is to be formed, said base electrode having a high concentration of a reverse conductivity impurity, and an interlaminar insulating layer deposited on said base electrode, said process comprising the steps of:

forming a hole through said interlaminar insulating layer and said base electrode, and extending into said silicon substrate;

forming said emitter layer at a bottom portion of said hole, whereby a vertical physical separation exists between said base electrode and said emitter layer;

said hole having a depth sufficient to eliminate contamination of said emitter by said reverse conductivity impurity from said base electrode without generating shear stress which exceeds a critical value for dislocation of components in said device;

wherein said vertical physical separation is within a range of 0.03 μm to 0.10 μm.

* * * * *